United States Patent [19]

Kramer et al.

[11] Patent Number: 4,665,367
[45] Date of Patent: May 12, 1987

[54] MULTIPLEXED MAGNETIC RESONANCE IMAGING OF VOLUMETRIC REGIONS

[75] Inventors: David M. Kramer, Cleveland Heights; Hong-Ning Yeung, Richmond Heights; Russell A. Compton, Chesterland, all of Ohio

[73] Assignee: Technicare Corporation, Cleveland, Ohio

[21] Appl. No.: 766,613

[22] Filed: Aug. 16, 1985

[51] Int. Cl.$^4$ ............................................. G01R 33/20
[52] U.S. Cl. ................................................... 324/309
[58] Field of Search ............... 324/300, 307, 309, 318, 324/322

[56] References Cited

U.S. PATENT DOCUMENTS 4,297,637  10/1981  Crooks ................................ 324/309
4,318,043  3/1982   Crooks ................................ 324/309
4,431,968  2/1984   Edelstein ............................ 324/309

OTHER PUBLICATIONS

B. C. Hill et al, "Operating Principles of NMR Imaging", published in Computed Technology of the Whole Body, vol. 2, ed by J. R. Hagga et al, (1983), at pp. 1038 et seq.

Primary Examiner—Michael J. Tokar
Attorney, Agent, or Firm—W. Brinton Yorks, Jr.

[57] ABSTRACT

In a magnetic resonance imaging system, a multiplexing technique is used to image volumetric regions by performing a number of scans within the recovery time of the spin systems. The multiple scans acquire signal information from sub-regional volumes by phase-encoding in the direction of the excitation gradient.

15 Claims, 17 Drawing Figures

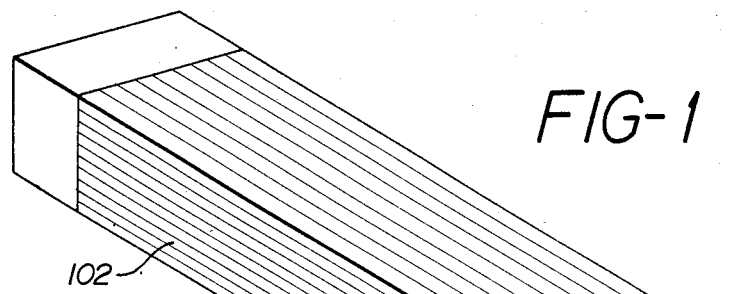
FIG-1
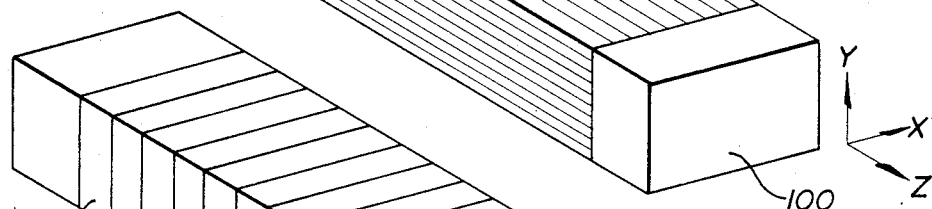
FIG-2
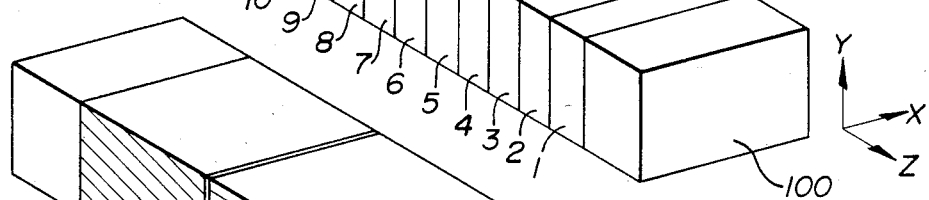
FIG-4
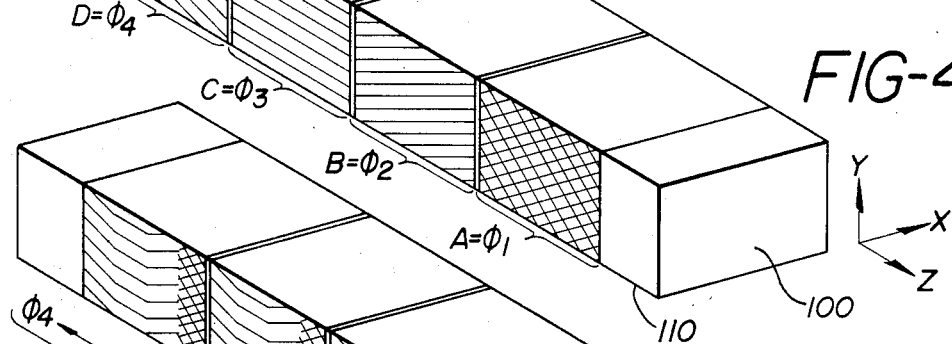
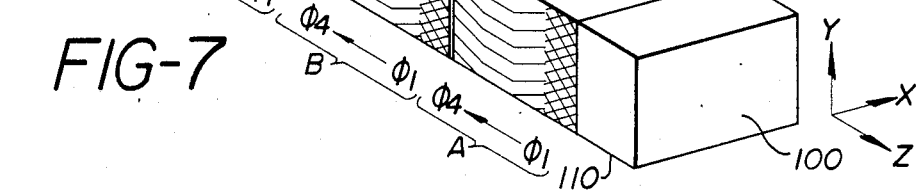
FIG-7

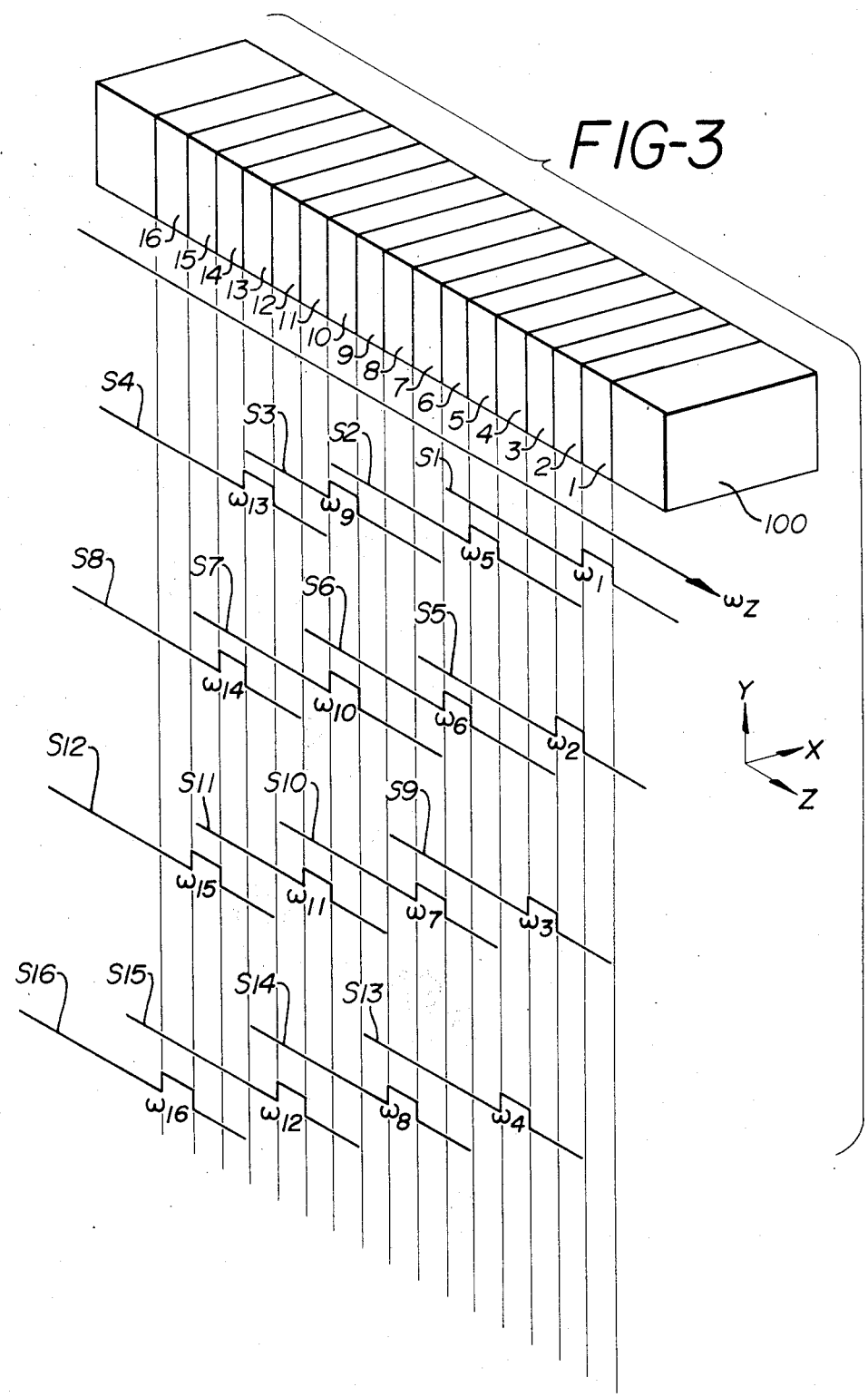

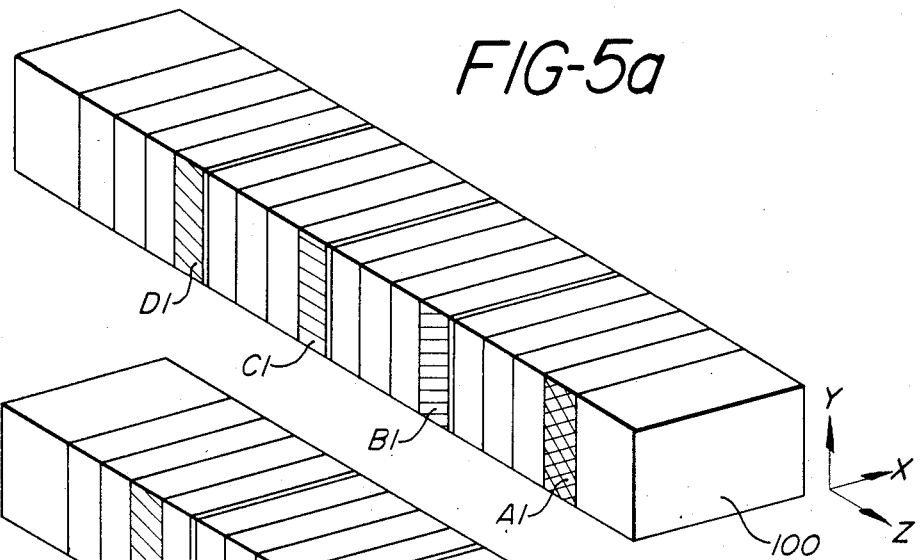
FIG-5a
FIG-5b
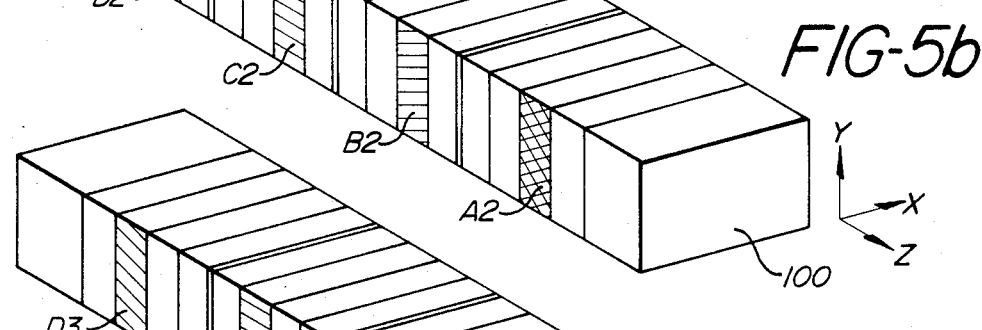
FIG-5c
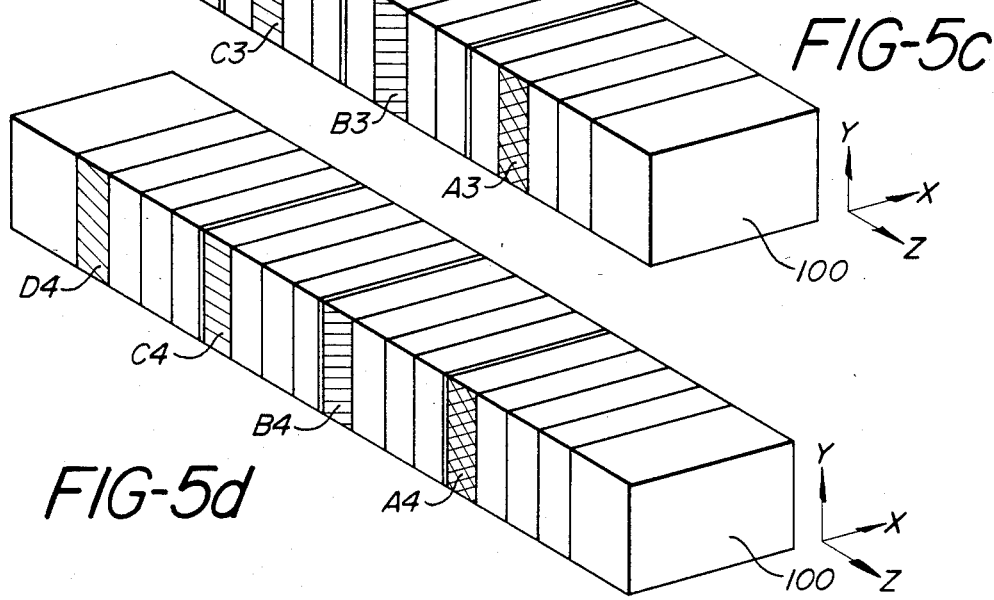
FIG-5d

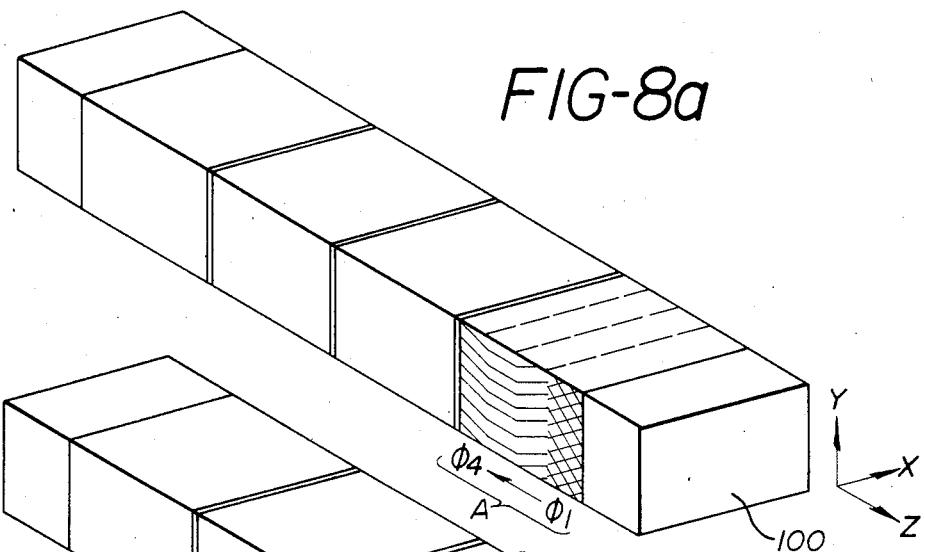
FIG-8a
FIG-8b
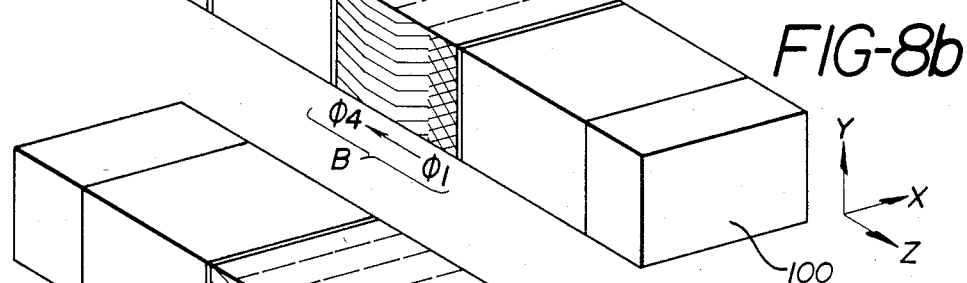
FIG-8c
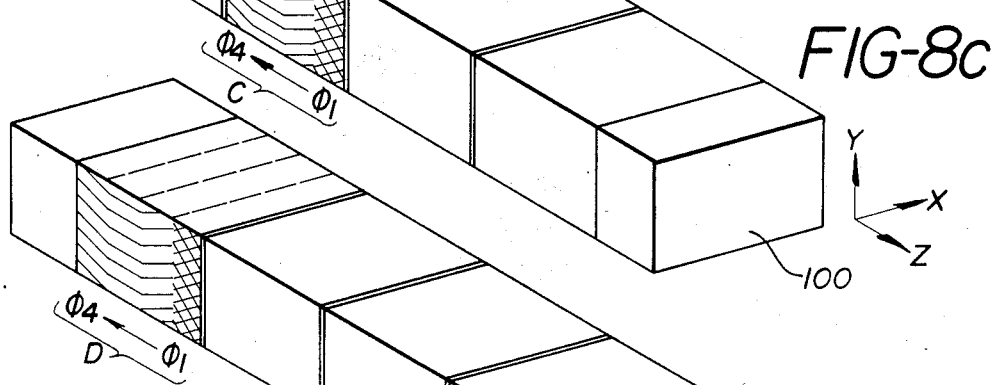
FIG-8d

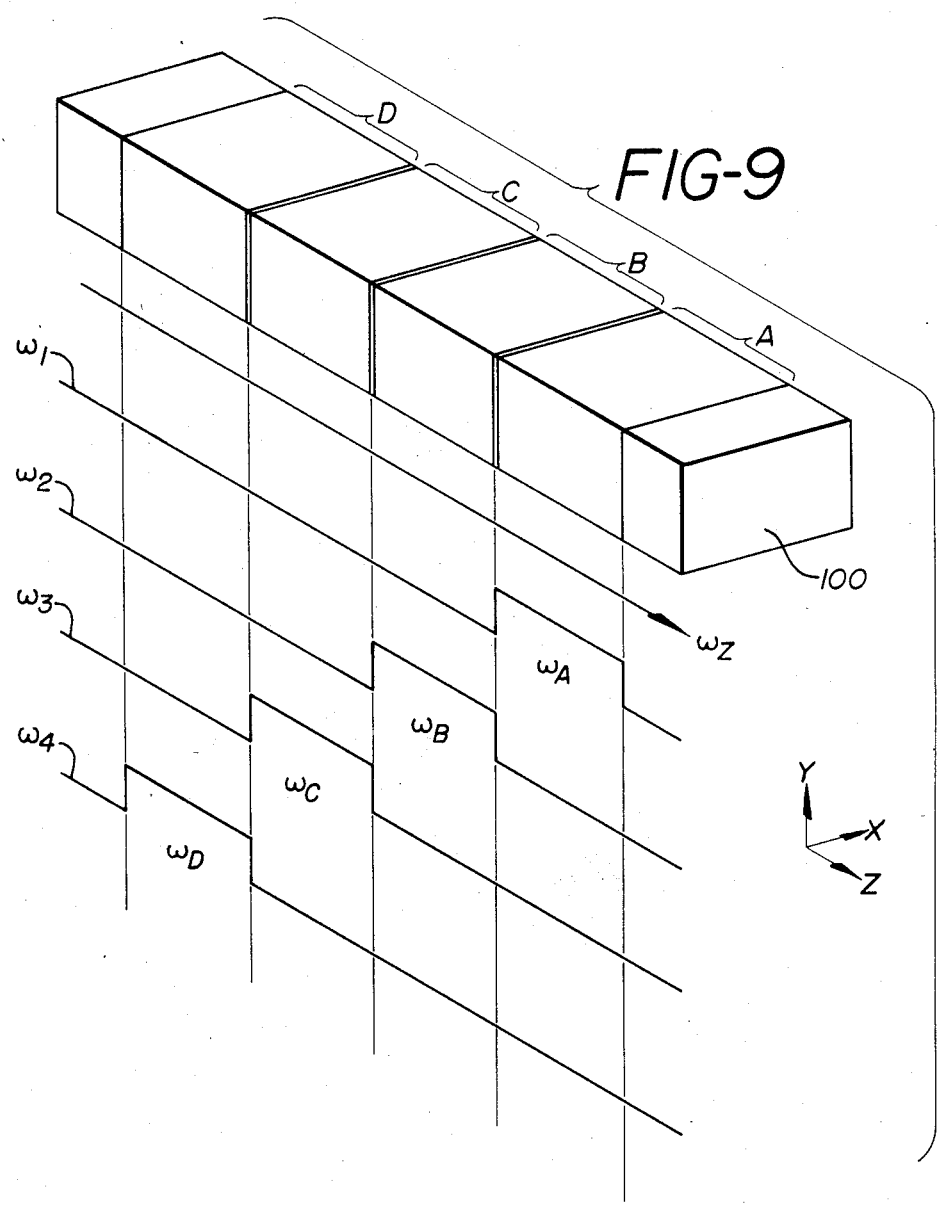

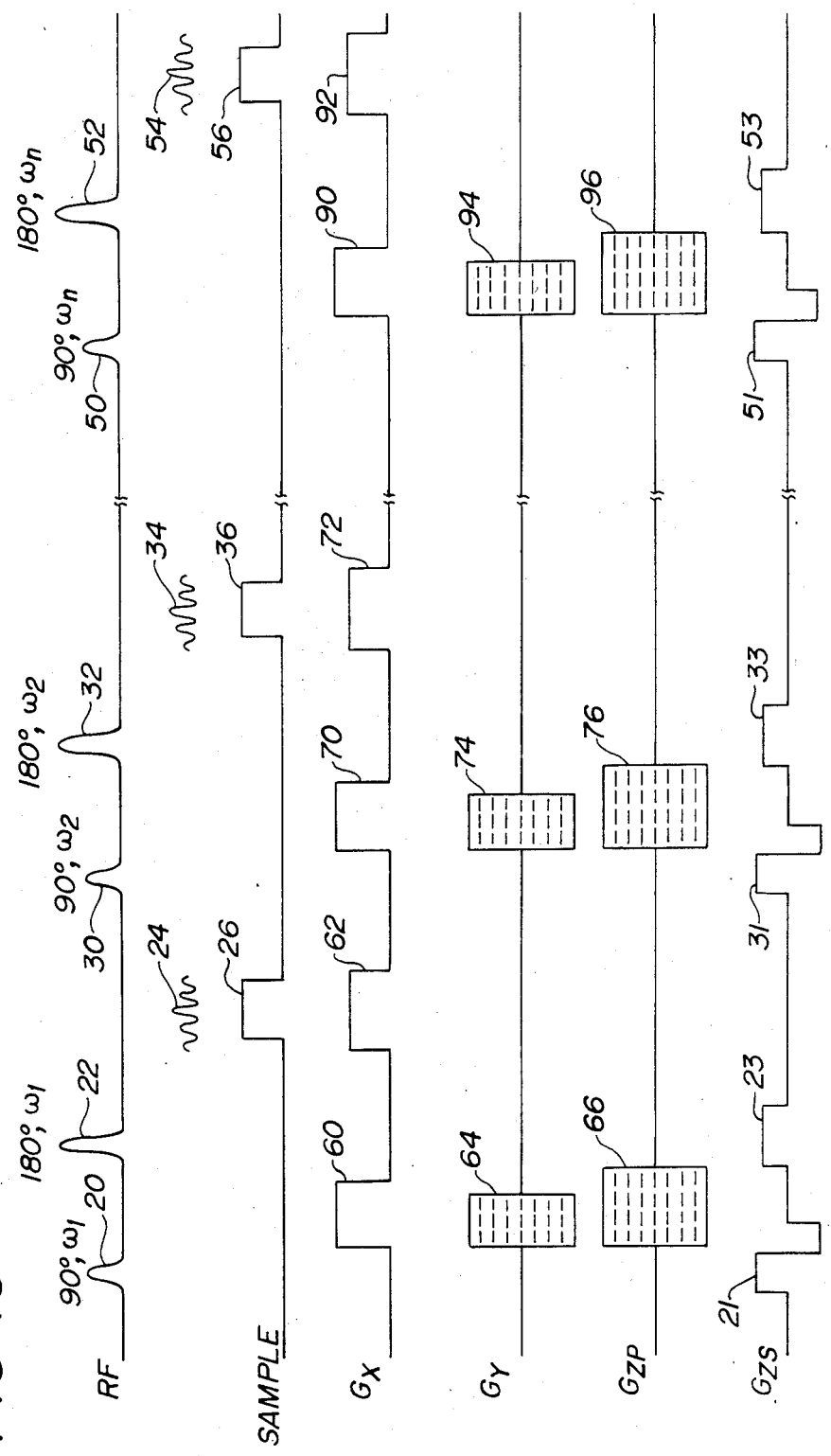

MULTIPLEXED MAGNETIC RESONANCE IMAGING OF VOLUMETRIC REGIONS

This invention relates to magnetic resonance imaging (MRI) systems and, in particular, to techniques for simultaneously gathering nuclear magnetic resonance (NMR) signal information from a plurality of regions of a volume being imaged.

In magnetic resonance imaging it is possible to create several different types of images of a subject. One common image type is the two-dimensional (2D) image of a planar region or slice through the subject. In planar imaging a thin slice of the subject is selectively excited to the exclusion of the surrounding volume. The two major dimensions of the selected slice are then spatially encoded by the application of orthogonal magnetic field gradients. In the Fourier technique, one is a phase encoding gradient and the other a frequency encoding gradient. The gathered NMR signal information is processed by two-dimensional Fourier transformation to reconstruct an image of the desired plane. In two-dimensional imaging the time required to gather the necessary signal information from a live subject, the scan time, is generally relatively short. In this short imaging time the signal information will be relatively uncontaminated by artifacts due to breathing, movement of the subject, and other motion-related factors. The resultant image, with its low content of motion artifacts, will be a relatively sharp and clearly defined picture of the internal structure or anatomy of the subject.

A second image type is the three-dimensional image. The three-dimensional image advantageously presents structural and anatomical detail in all three dimensions. Such an image may be formed by selectively exciting a predetermined volume of the subject. The volume is once again spatially encoded by magnetic field gradients and is scanned through to gather NMR signal information from points throughout the volume. The gathered NMR signal information is processed to reconstruct an image of the selected volume. However, the time required to scan through the entire volume is considerably longer than the time needed to scan a single plane. Hence, the three-dimensional image is intrinsically more sensitive to motion of the subject. The high degree of motion artifact contamination thus usually results in a decision to perform multiple 2-D scans rather than the three-dimensional scan. By forming images of a plurality of parallel slices of the volume, the same region can be viewed by sequentially stepping through the sequence of 2-D images instead of viewing the three-dimensional volume image.

However, the taking of separate 2-D images is also a lengthy process. The scan time can be reduced, though, by acquiring signal information in rapid sequence from small groups of the full number of slices. After one slice has been interrogated, there is normally a waiting period, or recovery time, before the spin system of the slice has relaxed and the slice can be interrogated again. During this recovery time others of the desired slices can be interrogated. The acquisition of NMR information from a number of slices during the waiting period is commonly known as multiple slice NMR imaging. However, it is generally not possible to interrogate all slices, but only a limited number of slices, during a single waiting period. Moreover, the multiple slice technique suffers from a poorer signal to noise ratio than the three-dimensional imaging technique under the conditions that the desired waiting period before the sequence can be repeated is too short to obtain all of the NMR information from all of the slices.

In medical diagnostic MRI the investigator tries to optimize the choices of the recovery time, termed $T_R$, and the time interval between the excitation of a slice and the subsequent reception of spin echo signals from the slice, termed $T_E$, or echo time. The choices are made in order to distinguish the different properties of tissue as revealed by their NMR characteristics. In general, a long $T_E$ interval will yield better $T_2$ contrast between different tissue, and a short $T_R$ period will yield better $T_1$ contrast. But a long $T_E$ and a short $T_R$ will both result in reducing the number of slices that can be interrogated during a single $T_R$ period. The optimum choices of radio frequency (RF) pulse timings for good tissue contrast are thus in opposition to the choices that optimize the speed of multiple slice data acquisition. Accordingly, it would be desirable to provide greater flexibility to the investigator who is trading off these choices.

Furthermore, it would be desirable to perform magnetic resonance imaging in a manner which preserves all the information of the three-dimensional image but with shorter scan times that are less sensitive to motion. Also, the desired technique should provide a signal to noise characteristic at least equal to that of the multiple slice technique.

In accordance with the principles of the present invention, a magnetic resonance imaging technique is provided in which spatially encoded image information is gathered in a multiplexing manner. During a single predetermined recovery time interval of the spin system, a plurality of volumetric region or "slabs" are sequentially selectively excited. As each region is excited, its volume is phase encoded by magnetic field gradients in two directions, one of which is in the direction of the selective excitation gradient. After the last region has been scanned, the sequence repeats, but with a change in one of the phase encoding gradients. Periodically, the other phase encoding gradient is also varied. Thus, during the recovery time of a single region, a plurality of regions are scanned, with multiplexed variation of the phase encoding gradients over a number of sequences. In this way, volumetric information from a plurality of regions is gathered quickly and with good sensitivity.

The principles of the present invention are applicable to Fourier transform imaging and other imaging geometries such as 3-D back projection as well.

In the drawings:

FIG. 1 illustrates a block of material with a volumetric region which is to be imaged;

FIG. 2 illustrates multiple slice imaging of the volumetric region of FIGS. 1;

FIG. 3 illustrates selective excitation of the multiple slices of FIG. 2;

FIG. 4 illustrates the division of the volumetric region of FIG. 1 into slabs for multiplexed imaging in accordance with the principles of the present invention;

FIGS. 5a–5d illustrate multiplexed imaging of the slabs of FIG. 4;

FIG. 7 illustrates a second division of the volumetric region of FIG. 1 into slabs for multiplexed imaging in accordance with the principles of the present invention;

FIGS. 8a–8d illustrate multiplexed imaging of the slabs of FIG. 7;

FIG. 9 illustrates selective excitation of the slabs of FIG. 7;

FIG. 10 illustrates signal waveforms for the acquisition of NMR information in accordance with the principles of the present invention.

Figure 6:
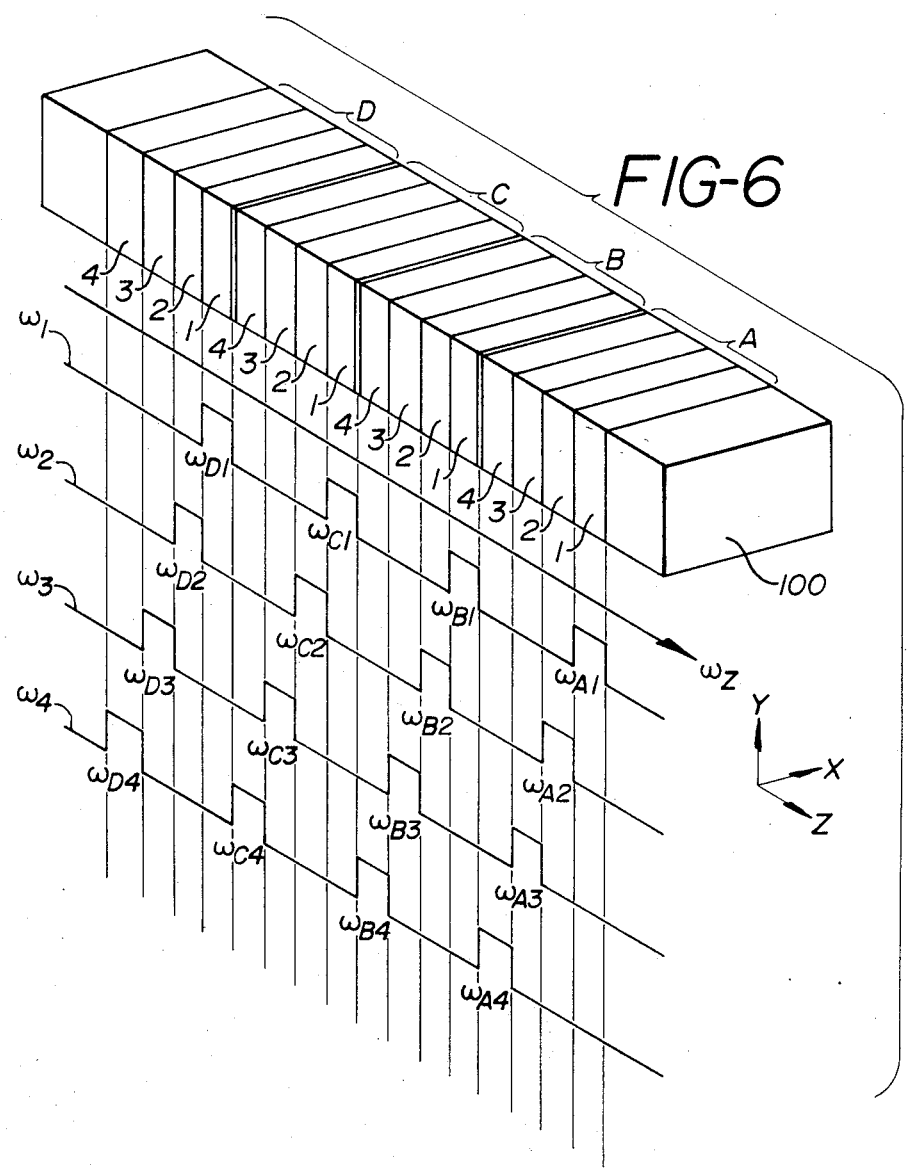
FIG. 6 illustrates selective excitation of the slabs of FIG. 4.

Referring to FIG. 1, a rectangular block 100 of a material which is to be imaged is shown. As an example, suppose that volumetric region 102 of the block is to be imaged. FIG. 1 is shown with reference to the axes drawn adjacent the FIGURE. That is, the longest dimension of the block 100 is aligned with the z axis, and the rectangular face of the block is in the x-y plane.

Suppose then that a simple selective three dimensional image is formed of the region 102 using the conventional spin echo signal technique. This technique is described in the article "Operating Principles Of NMR Imaging", by B. C. Hill, et al., published in *Computed Tomography of the Whole Body*, Vol. 2, ed. by J. R. Haagg et al. (1983), pp. 1038 et seq. at page 1051. If the block is a volume of a living subject with a typical $T_1$ for animal anatomy, an NMR spin echo signal might typically be acquired 30 milliseconds after excitation of a given region by a radio frequency (RF) excitation pulse, ie., $T_E = 30$ ms. However, the spin systems must be allowed to recover their orientation with the static magnetic field to a certain degree before the spin systems can be reexcited. Typically, this recovery time $T_R$ may be 200 milliseconds.

Two further assumptions are necessary to complete the three dimensional imaging example, which are the Fourier encoding of the y and z dimensions of the region. It will be assumed that the y dimension comprises 256 data lines and that the z dimension comprises sixteen phase-encoded gradient levels for the Fourier transform processing of image information.

With these assumptions, it is seen that a single NMR signal can be acquired during every successive 200 millisecond interval. To acquire the necessary signals for the y-direction dimension, a sequence of 256 such acquisitions or scans would be performed, each with a different y-direction gradient value. And since the volume comprises 16 phase-encoded levels in the z-direction, sixteen such sequences of 256 scans are performed, each of the sixteen with a different z-direction gradient value. To reconstruct an image of the volume, three Fourier transforms are performed on the scan data, a so-called 3D Fourier transform. The time required to complete the scanning is thus (200 ms.) (256 y-gradients) (16 z-gradients) = 13.6 minutes. In addition, reconstruction using a 3D Fourier transform of this amount of data requires significant processing time. However, the three dimensional image will exhibit a good signal to noise characteristic, since the entire volume is excited during each scan. For comparison purposes, a signal-to-noise factor of 100 will be designated for the three dimensional image.

The same volume may be imaged by acquiring the NMR signal information using a two-dimensional multiple slice technique. In this technique, image information from several planar slices is acquired sequentially during a single recovery interval $T_R$. Referring to FIG. 2, for multiple slice imaging the volume 102 is conceptually divided into sixteen parallel planar slices which are to be imaged. The slices are not imaged in their numerical sequence, but in a staggered order. This is to prevent the selection of immediately adjacent slices simultaneously, or in immediately consecutive order. Since the RF excitation pulses normally will not sharply define the planar boundaries of a slice, there is in practice a small region of overlap at the boundary region when adjacent slices are excited simultaneously or in immediate succession. Signals from the overlap area will be saturated due to multiple excitations, resulting in the loss of proper image contrast in these areas. To prevent this undesirable condition, the slices are selected as represented by FIG. 3.

Referring to FIG. 3, a multiple slice selection sequence is illustrated. The block 100 is shown in relation to the variation in frequency $\omega_z$ which is provided by the slice selecting z gradient. The frequency characteristics of the RF slice selecting pulses are illustrated below the block 100. The first slice is selected as shown by the S1 characteristic, which selects slice 1 with an $\omega_1$ frequency characteristic. Using the same timing relationship as in the first example, an NMR spin echo signal may acquire 30 milliseconds after the slice-selecting RF pulse is applied. Approximately 20 milliseconds are allowed for the completion of NMR signal acquisition and for the effects of gradient switching to subside, whereupon slice 5 is selected by an RF pulse exhibiting an $\omega_5$ characteristic as shown by the S2 characteristic. Spin echo signals from slice 5 are acquired 30 milliseconds later and 20 milliseconds thereafter slices 9 and 13 are excited in a similar manner, as indicated by the S3 and S4 characteristics. Thus, a different slice is selected and NMR signal information acquired every 50 milliseconds. Within the 200 millisecond recovery time $T_R$, four slices are interrogated. The four slice sequence is then repeated for slices 2, 16, 10 and 14, followed by two additional four slice sequences for the remaining slices. The pulse and gradient timings for the multiple slice sequence are shown in concurrently filed U.S. patent application Ser. No. 766,617 entitled "Phase Sensitive Detection in Multislice Magnetic Resonance Imaging Systems".

Using the same criteria as in the three dimensional example, the total scanning time is calculated as follows. Since four slices are interrogated every 200 milliseconds, it takes 800 milliseconds to interrogate all sixteen slices. To acquire the necessary information to discriminate in the y-direction, the sixteen slices must be interrogated 256 times, each with a different Y-gradient level. The minimum total scanning time is thus 4 scans times (200 msec) (256 Y-gradients) = 3.4 minutes. This is an appreciable time saving as compared to the three dimensional technique, since each of the four scans takes less than a minute to complete.

The signal to noise characteristic is based upon the number of independent measurements that are combined in each image, which is one-sixteenth that of the 3D example. The square root of sixteen is four, indicating a factor of four reduction in signal to noise. Using the same basis as the factor of 100 for the three dimensional technique, the multiple slice technique will have a signal to noise factor of 25.

In accordance with the principles of the present invention NMR signal information is acquired from the volumetric region 102 of the block 100 by conceptually dividing region 102 into a number of volumetric slabs which are spatially encoded by phase encoding in the direction of the slice or slab-selecting gradient. Referring to FIG. 4, the region 102 is divided into four slabs, A, B, C and D. The slabs are respectively phase-encoded in the slab-selecting z-gradient direction as indicated by phases $\phi_1$, $\phi_2$, $\phi_3$, and $\phi_4$. The shadings of the slabs correspond to this phase-encoding.

To provide the same resolution as in the multiple slice technique, individual slices of the slabs are selected as illustrated in FIGS. 5a–5d. In a first selective excitation, slices A1, B1, C1 and D1 are selected as indicated in FIG. 5a. Since these four slices are excited simultaneously, NMR signal information will be produced by the four slices at the same time. The signals from the four slices are discriminated by the phase encoding in the z direction. The signals from the respective slices will exhibit respectively different phases.

After the first four slices are selected and their signal information gathered, slices A2, B2 and C2 are similarly interrogated as indicated in FIG. 5b. Likewise, the remaining eight slices are interrogated as indicated in FIGS. 5c and 5d.

The characteristics of the RF excitation pulses used to select the slices in FIGS. 5a–5d are shown in FIG. 6. The first RF excitation pulse is represented by the $\omega_1$ frequency characteristic, and contains frequency bands $\omega_{A1}$ $\omega_{B1}$, $\omega_{C1}$, and $\omega_{D1}$ to select the first four slices. The frequency characteristics of the second, third and fourth RF pulses are shown as characteristics $\omega_2$, $\omega_3$, and $\omega_4$.

Returning to FIGS. 5a–5d, the sequence there represented is repeated 256 times for the 256 levels of the phase-encoding gradient in the y-direction. Then, 256 additional sequences are performed with z-gradient variation, this time with different phases being assigned to the four slabs according to their z-position. In practice, a new level is used for the phase-encoding gradient pulse in the z-direction to accomplish this. Two more sequences of 256 y-gradient lines are then performed, each with a different z-gradient level, for a total of four iterations. This corresponds to the selection of four slices by each RF pulse and provides information needed to discriminate the four slices of each excitation during Fourier transform reconstruction.

Using the same criteria as in the previous examples, the scanning time is calculated as follows. The interrogation of each group of four slices in FIGS. 5a–5d is performed in 30 milliseconds. Allowing another 20 milliseconds between each scan for gradient effects to dissipate, it is seen that information from each group of four slices may be gathered every 50 milliseconds. Thus, all sixteen slices are interrogated every 200 milliseconds. Multiplying this period by the number of y-gradient levels gives (200 msec) (256 y-gradients)=51.2 seconds. Repeating this scanning period by the four iterations necessary for z-gradient variation gives (512 sec) (4 z-gradients)=3.4 minutes, the same time saving as in the multiple slice example. The comparable signal to noise factor for this embodiment of the present invention is 50, since each separate slice location is selected only one-fourth as often as the 3D example, but four times more than in the 2D multiple slice technique. A major difference as compared with the multiple slice example is that phase-encoding in the z-gradient direction is used to discriminate the signals received simultaneously from four slices, a condition not present in the multiple slice technique.

In accordance with the principles of a further aspect of the present invention, another imaging technique is provided which retains the shorter scanning times of the 2D multiple slice technique but with an improved signal-to-noise figure. In this second technique, the region 102 is again conceptually divided into four slabs A, B, C and D as shown in FIG. 7. NMR signal information is then sequentially acquired from each slab in its entirety. Within each slab, z-direction phase encoded slices are designated as shown in FIG. 7. Phase-encoded signal information is thus gathered from every slice in the slab simultaneously and is discriminated within each slab by Fourier transformation of the phase-encoded information.

The selective excitation of each slab in sequence is performed by application of a z directed gradient together with RF pulses of frequency content illustrated in FIG. 9. As in FIGS. 3 and 6, line $\omega_z$ indicates the direction of variation of the z gradient. Slab A is selected by an RF pulse having a frequency content $\omega_A$ as illustrated by characteristic $\omega_1$; slab B by characteristic $\omega_2$; slab C by characteristic $\omega_3$; and slab D by characteristic $\omega_4$. The slab-selecting RF pulses are easier to tailor in terms of their frequency content than the RF pulses used to select multiple thin slices in the 2D multiple slice technique discussed above, and generally can be applied in less time than the RF pulses needed to seelct thin slices.

The sequence of signal acquisition for the second embodiment is illustrated in FIGS. 8a–8d. In FIG. 8a, the first slab A is interrogated, with phase encoding in the z-direction of the slab as indicated by $\phi_1$–$\phi_4$. Thereafter, slab B is similarly interrogated as shown by FIG. 8b, followed by slabs C and D as shown by FIGS. 8c and 8d. In each case, the same phase-encoding in the z-direction of the slab may be employed.

A pulse sequence useful for performing the multislab techniques of the present invention is shown in FIG. 10. A 90° RF pulse 20 is applied to the block 100. This RF pulse exhibits a frequency content $\omega_1$, corresponding to the spectra of $\omega_1$ in either FIG. 6 or FIG. 8. The RF pulse 20 is coincident in time with a slice or slab-selecting z-directed gradient $G_{zs}$, shown as pulse 21 in FIG. 10. Following slice or slab selection three additional gradients are applied. The $G_x$ gradient 60 preconditions the spin system for the frequency encoding gradient in the x-direction. One level of a level-variable $G_y$ gradient 64 is applied. The slab is phase encoded in the z direction by applying one level of a z-directed phase encoding $G_{zp}$ gradient shown at 66. In the present examples of FIGS. 4 and 7, with four phases in each excitation, the $G_{zp}$ gradient would exhibit one of four possible levels.

After the three spatially encoding gradients have been applied a 180° RF pulse 22 is applied to the slab or slices in the presence of a $G_{zs}$ gradient 23. This insures that only the spin systems of the selected slab or slices are inverted for the generation of a spin echo signal, leaving the spin systems of other slabs or slices unaffected while they recover to their orientation with the static magnetic field. Thereafter spin echo signals 24 develop in the selected slab or slices, and are sampled during a sampling period 26 in the presence of a $G_x$ gradient 62.

When the effects of the switched gradients have subsided a scan is performed on slab B or the second group of slices. A 90° RF pulse 30 is applied to the block 100 in the presence of slice or slab selecting gradient $G_z$, shown at 31. The frequency content $\omega_2$ of the RF pulse 30 is that of the $\omega_1$ waveforms in FIG. 6 or FIG. 9. Spatially encoding gradients 70, 74 and 76 are applied as before, and the spin systems are inverted by a frequency selective 180° RF pulse 32 in the presence of $G_{zs}$ gradient 33. Spin echo signals 34 develop from slab B or slices A2, B2, C2 and D2, which are sampled during an interval 36 in the pescence of a $G_x$ gradient 72.

The breaks in the lines of FIG. 10 indicate that numerous scans of various slabs or slice groups may be performed within the selected recovery time $T_R$ of the spin systems. The last scan of the sequence is shown to the right of the breaks, where a 90° RF pulse 50 selects the last slab or slice group n, which in the example of four slabs or slice groups is slab D or slices A4, B4, C4 and D4. The RF pulses 50 and 52, the slice selecting $G_{zs}$ gradients 51 and 53, the spatially encoding gradients 90-96, and the sampling interval 56 and spin echo signals 54 are similar to those of the preceding scans, but are specific to the last slab or slice group n, which are slab D and slices A4, B4, C4 and D4 in the examples.

After the last spin echo signals 54 have been acquired and gradient effects have subsided, the full sequence of FIG. 10 is repeated, this time using the same value as before for one of the phase-encoding gradients and a different value for the other phase-encoding gradient. In a constructed embodiment, the $G_{zp}$ gradient 66 is held constant while the $G_y$ gradient 64 is changed to the next line value. The term "line" as used here does not refer to a single physical line through a slab, since phase-encoded information is gathered from the entire volumetric slab or several slice volumes during each scan. Rather, the term line means a particular value of the $G_y$ gradient which is used in Fourier transformation of the acquired data. The new value for the $G_y$ gradient line is used for gradients 64, 74 and 94 during the second sequence. The sequence is thereafter repeated, each time with a new $G_y$ line value, until the $G_y$ gradient has been sequenced through all its line values, which is 256 in the present examples.

Thereafter, the sequence of 256 y-line variable iterations is repeated once more each each value of the $G_{zp}$ gradient. For the four phase variations of each slab or slices shown in FIGS. 4 and 7, the scanning is completed when the $G_{zp}$ gradient has been sequenced through all four of its possible levels. In the present examples one slab or slice group is scanned once in about 50 milliseconds and all four slabs or groups are therefore scanned in 200 milliseconds. The complete scanning time for the block 100 thus takes (200 milliseconds) (256 y-gradients) (4 z-gradients)=3.4 minutes. The signal to noise factor for the technique illustrated by FIGS. 7 and 8a-8d is the same as that of the technique illustrated by FIGS. 4 and 5a-5d.

Figure 11:
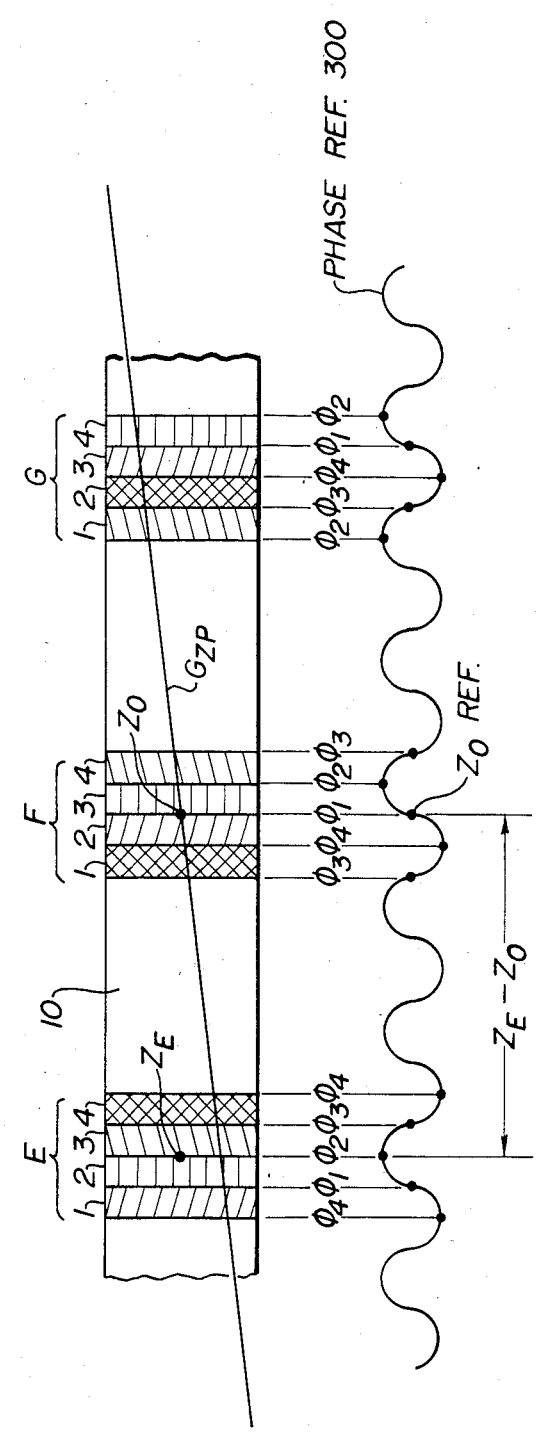
FIG. 11 illustrates a technique of ordering contiguous slices of a multiple number of slabs.

When a subject is imaged using the multislab technique one of the slab volumes is generally, although not necessarily, centered with respect to the center, or null point of the slab selection gradient field. As shown in FIG. 11, slab F is centered with respect to the center $Z_o$ of the $G_{zp}$ gradient field. On one side of the $Z_o$ point the phase rotation due to the $G_{zp}$ gradient is relatively positive, and on the other side of the $Z_o$ point the $G_{zp}$ gradient phase rotation is relatively negative. Since the $Z_o$ point is located at the interface of phase encoded slices 2 and 3 of slab F, the interface will have a known phase with respect to the reference 300 used during phase sensitive detection of the NMR signals. Accordingly, the other slice boundaries of slab F will also have known phases. In the simplified example of FIG. 9, the $Z_o$ reference phase is shown as $\Phi_1$, and the sequence of phase values of slab F is $\Phi_3$, $\Phi_4$, $\Phi_1$, $\Phi_2$, and $\Phi_3$, which phase sequence is represented by the slice shadings. The phase sequence properly identifies the sequence of the slices in the slab during image reconstruction.

While slab F of FIG. 9 is centered with respect to the gradient null point $Z_o$, the same is not true of the other slabs E and G. These slabs will be in regions of the $G_{zp}$ gradient field where the gradient phase rotation is either entirely positive or entirely negative with respect to the field at $Z_o$. While a uniform bias gradient could be used to shift the effective $G_{zp}$ gradient null point to each slab center during slab selection and spatial encoding as described in U.S. patent application Ser. No. 621,396 filed June 18, 1984, now U.S. Pat. No. 4,636,728 and entitled "Offset Gradient Fields in Nuclear Magnetic Resonance Imaging Systems", it may be desirable to use the same $G_{zp}$ gradient for each slab. In such case, those slabs remote from the center slab will be encoded with phase values dependent upon their spatial location, causing a reordering of the phases at the respective slice boundaries. For instance, the interface between slices 2 and 3 of slab E in FIG. 11 is at a point $Z_E$ in the $G_{zp}$ gradient field. This causes the boundary of slices 2 and 3 of slab E to be at a phase of $\Phi_2$ with respect to the phase reference 300, instead of $\Phi_1$ as was the case of slab F. Similarly, the center of slab G is at a phase of $\Phi_4$ with respect to the phase reference 300. This reordering of the sequence of phases within each slab would cause the slices to be organized in an incorrect sequence in the different slabs unless this resequencing is taken into consideration during image reconstruction.

To reorder the slices of each slab to their proper physical sequence, a correction is made which is a function of the $G_{zp}$ gradient field and the spatial locations of the respective slabs. The $G_{zp}$ gradient is known to have a characteristic variation, expressed as a change in Gauss per centimeter. For slab E, the physical distance between point $Z_E$ and the null point $Z_o$ is also a known quantity. A correction factor is thus determined by multiplying $G_{zp}$ (Gauss/cm) by slab distance $(Z_E - Z_o)$ and multiplying this intermediate term by the gyromagnetic ratio $\gamma$ for the magnetic field. This correction factor is then used as a product term applied to the slices of slabs remote from the center slab. The correction reorders the phases of slices of the remote slabs to the same sequence as the slices of the center slab for presentation of all slabs and slices in their correct physical sequence.

The present inventive techniques are also applicable to other reconstruction techniques, such as three dimensional back projection reconstruction. In 3D back projection, the excitations, and signal readout will be multiplexed as described above, with variation of the direction of rotation of the frequency-encoding gradient in a plane orthogonal to that of the slab selecting gradient. This multiplexing is then repeated with variation in a plane which includes that of the slab selecting gradient. Image reconstruction is then performed on the acquired information using 3D back projection. Moreover, the back projection and Fourier techniques can be combined, as by performing rotation perpendicular to the slab-selecting gradient and phase-encoding in parallel with the slab-selecting gradient.

What is claimed is:

1. In a magnetic resonance imaging system, a method for imaging a plurality of volumetric slabs within a subject comprising the steps of:
   (a) exciting one of said volumetric slabs with a radio frequency excitation pulse applied in time coincidence with a field gradient in a first direction;

(b) applying a frequency-encoding gradient to said slab in a second direction, a phase-encoding gradient in a third direction, and a phase-encoding gradient in said first direction;

(c) acquiring NMR signal information from said slab;

(d) repeating steps (a) through (c) for additional ones of said slabs by using radio frequency excitation pulses tailored for selective excitation of said respective slabs, wherein steps (a) through (d) are completed within a predetermined recovery time for the spin systems being imaged;

(e) repeating steps (a) through (d) with variation of one of said phase-encoding gradients;

(f) repeating steps (a) through (e) with variation of the other of said phase-encoding gradients; and (g) reconstructing an image using said acquired NMR signal information.

2. The method of claim 1, wherein each of said volumetric slabs comprises a plurality of phase-encoded regions.

3. The method of claim 2, wherein said regions of each slab are contiguous.

4. The method of claim 2, wherein said regions of each slab are not contiguous.

5. In a magnetic resonance imaging system, a method for imaging a plurality of volumetric slabs within a subject comprising the steps of:

(a) simultaneously exciting respective portions of ones of said slabs with a radio frequency excitation pulse applied in time coincidence with a field gradient in a first direction;

(b) applying a frequency-encoding gradient to said slabs in a second direction, a phase-encoding gradient in a third direction, and a phase-encoding gradient in said first direction;

(c) acquiring NMR signal information from said slabs;

(d) repeating steps (a) through (c) for other portions of said slabs by using radio frequency excitation pulses tailored for selective excitation of said portions, wherein steps (a) through (d) are completed within a predetermined recovery time for the spin systems being imaged;

(e) repeating steps (a) through (d) with variation of one of said phase-encoding gradients;

(f) repeating steps (a) through (e) with variation of the other of said phase-encoding gradients; and (g) reconstructing an image using said acquired NMR signal information.

6. The method of claim 5, wherein said simultaneously excited portions are differently phase-encoded.

7. The method of claim 6, wherein the portions of a given slab are similarly phase-encoded.

8. In a magnetic resonance imaging system, an imaging signal sequence comprising:

(a) applying an RF pulse together with a gradient of a first direction of variation;

(b) applying phase-encoding gradients exhibiting variation in said first direction and in a second direction;

(c) applying a frequency-encoding gradient in said third direction;

(d) acquiring NMR signal information;

(e) repeating steps (a) through (d), each time using an RF pulse with a different spectral characteristic, wherein steps (a) through (e) are completed within a predetermined recovery time;

(f) repeating steps (a) through (e) with variation of one of said phase-encoding gradients;

(g) repeating steps (a) through (f) with variation of the other of said phase-encoding gradients; and (h) reconstructing an image using the acquired NMR signal information.

9. The sequence of claim 8, wherein step (h) comprises the step of reconstructing an image by three-dimensional Fourier transformation of said acquired NMR signal information.

10. In a magnetic resonance imaging system, a method for imaging a volumetric region comprising the steps of:

(a) conceptually dividing said volumetric region into a plurality of volumetric slabs, and said respective slabs into slab portions;

(b) acquiring NMR signal information from a group of portions of said slabs simultaneously, said portions of said group being respectively differently spatially encoded;

(c) repeating step (b) for at least one additional, different group of portions;

(d) repeating steps (b) and (c) with variation of the spatial encoding of said portions; and (e) reconstructing an image using the acquired NMR signal information.

11. The method of claim 10, wherein said spatial encoding comprises phase encoding.

12. The method of claim 11, wherein said portions of said group are selected in step b) during application of a gradient of a given direction, and wherein said phase encoding is performed in said given direction.

13. The method of claim 10, wherein said spatial encoding is performed by rotation of the direction of a gradient.

14. The method of claim 13, wherein said portions of said group are selected in step b) during application of a gradient of a given direction, and wherein said gradient rotation is performed in a plane including said given direction.

15. In a magnetic resonance imaging system, a method for imaging a plurality of volumetric slabs within a subject comprising the steps of:

(a) exciting one of said volumetric slabs with a radio frequency excitation pulse applied in time coincidence with a field gradient in a first direction;

(b) applying a frequency-encoding gradient to said slab in a second direction;

(c) acquiring NMR signal information from said slab;

(d) repeating steps (a) through (c) for additional ones of said slabs by using radio frequency excitation pulses tailored for selective excitation of said respective slabs;

(e) repeating steps (a) through (d) with variation of the direction of rotation of said frequency-encoding gradient in a plane orthogonal to said first direction;

(f) repeating steps (a) through (e) with variation of the direction of rotation of said frequency-encoding gradient in a plane which includes said first direction; and (g) reconstructing an image using the acquired NMR signal information and three dimensional back projection.

* * * * *